(12) United States Patent
Lee et al.

(10) Patent No.: US 6,252,298 B1
(45) Date of Patent: *Jun. 26, 2001

(54) SEMICONDUCTOR CHIP PACKAGE USING FLEXIBLE CIRCUIT BOARD WITH CENTRAL OPENING

(75) Inventors: Kyu Jin Lee, Seoul; Wan Gyun Choi, Seongnam, both of (KR)

(73) Assignee: Samsung Electronics Co., Ltd., Suwon (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/081,564

(22) Filed: May 19, 1998

(30) Foreign Application Priority Data

Jun. 18, 1997 (KR) ................................................ 97-25371

(51) Int. Cl.[7] .................................................. H01L 23/495
(52) U.S. Cl. .......................... 257/668; 257/778; 257/650; 257/692; 257/784
(58) Field of Search ..................................... 257/666, 676, 257/692, 784, 786, 778, 678, 668, 690, 687, 684

(56) References Cited

U.S. PATENT DOCUMENTS

| | | | |
|---|---|---|---|
| 4,996,587 | * 2/1991 | Hinrichsmeyer et al. | 257/676 |
| 5,583,375 | * 12/1996 | Tsubosaki et al. | 257/692 |
| 5,650,593 | * 7/1997 | McMillan et al. | 174/52.4 |
| 5,674,785 | * 10/1997 | Akram et al. | 437/217 |
| 5,677,566 | * 10/1997 | King et al. | 257/666 |
| 5,866,949 | * 2/1999 | Schueller | 257/778 |
| 6,013,946 | * 1/2000 | Lee et al. | 257/684 |

* cited by examiner

*Primary Examiner*—Minh Loan Tran
*Assistant Examiner*—Luan Thai
(74) *Attorney, Agent, or Firm*—Jones Volentine, P.L.L.C.

(57) ABSTRACT

An active surface of a semiconductor chip is attached to the bottom surface of a flexible circuit board having a central opening. Input/output pads on the active surface of the chip are electrically connected to a circuit layer on the top surface of the flexible circuit board through the opening. The semiconductor chip package can thus be of a size on the order of that of the chip. The circuit layer on the circuit board includes bonding pads for receipt of metal wires, land pads for receipt of terminals, and circuit traces connecting the pairs of the bonding and land pads, respectively. The input/output pads, the bonding pads, and the wires are encapsulated in an encapsulant formed by dispensing a liquid resin having a certain viscosity into the opening in the flexible circuit board. A dam around the opening prevents the liquid resin from overflowing. The flexible circuit board may further include a protective layer for protecting the circuit traces, a stiffener, or an adhesive layer thereunder. The protective layer may have a groove in which the dam is formed.

19 Claims, 3 Drawing Sheets

SEMICONDUCTOR CHIP PACKAGE USING FLEXIBLE CIRCUIT BOARD WITH CENTRAL OPENING

BACKGROUND OF THE INVENTION

1 Field of the Invention

The present invention relates generally to a semiconductor device. More particularly, the present invention relates to a semiconductor chip package in which an active surface of a semiconductor chip is attached to a bottom surface of a flexible circuit board having a central opening, and in which input/output pads on the active surface of the chip are electrically connected to a circuit layer on a top surface of the flexible circuit board through the opening, so that the package can be reduced to a size on the order of that of the chip.

2 Description of the Prior Art

As semiconductor integrated circuit (IC) chips become increasingly sophisticated, the component density increases as does the number of input/output (I/O) pads per chip, resulting in larger chips. However, there is a continuing need to reduce the size of the semiconductor chip package to meet the need for smaller devices.

One of the packages that has been developed to meet this need is a ball grid array (BGA) package. The BGA package provides a relatively high surface-mount density and improved electrical performance as compared to a conventional plastic package. A distinct difference in the structure of the BGA package from the conventional plastic package is that the electrical interconnection between the semiconductor chip and a mother board is provided by a printed circuit board (PCB) having circuit patterns and solder balls instead of a lead frame.

The typical BGA package 10 is illustrated in FIG. 1. As shown in FIG. 1, the chip 11 is attached to the top surface of the PCB 12. The circuit patterns 13 on the top surface of the PCB 12 extend to the bottom surface through vias 15. The circuit patterns 13 on the top surface are electrically connected to the chip 11 by bonding wires 14, while those on the bottom surface are electrically connected to the mother board (not shown) by solder balls 16. Parts of the top surface of the PCB 12, the chip 11, and the bonding wires 14 are encapsulated by resin 17. The body of the PCB 12 is generally made of FR-4, FR-5, or BT (Bismaleimide triazine) resin. FR-4 and FR-5 are fire retardant epoxy glass-reinforced laminates.

The BGA package 10 is larger than the chip 11 because the PCB 12 used in the BGA package 10 requires an area without circuit patterns 13 to allow the chip 11 to be attached to the PCB 12. Furthermore, the width and the distance between adjacent circuit patterns 13 are limited to 70 $\mu$m, respectively. Therefore, it is difficult to manufacture a BGA package when circuit patterns 13 having a small width or a small degree of spacing there between are required.

SUMMARY OF THE INVENTION

It is therefore an object of the present invention to provide a semiconductor chip package of a size on the order of that of the semiconductor chip itself.

It is another object of the present invention to provide a semiconductor chip package employing a circuit board with fine circuit patterns.

It is still another object of the present invention to provide a semiconductor chip package which, by its design, prevents liquid resin from overflowing during the manufacture thereof.

It is still another object of the present invention to provide a semiconductor chip package in which the upper surface of an encapsulant is disposed below the upper surface of terminals.

It is still another object of the present invention to provide a semiconductor chip package having a coefficient of thermal expansion similar to that of a mother board.

The present invention achieves these and other objects by providing a semiconductor chip package which comprises a semiconductor chip having an active surface, and a plurality of I/O pads extending across central parts of the active surface. The package also includes a flexible circuit board having an electrically non-conductive flexible tape with a top surface, a bottom surface and a central opening therein. A circuit layer is patterned on the top surface of the flexible tape. The circuit layer has a plurality of circuit traces, bonding pads to which first ends of the traces are connected, and land pads to which the other ends of the traces are connected.

The active surface of the semiconductor chip is attached to the bottom surface of the flexible tape, so that the I/O pads on the chip are exposed through the opening of the flexible tape. Accordingly, a plurality of metal bonding wires are electrically interconnect the I/O pads and the bonding pads through the opening. Furthermore, the flexible circuit board can have an area nearly equal to that of the semiconductor chip. In other words, the present invention can provide a so-called chip sized package (CSP).

The I/O pads, the bonding pads, and the metal wires in the package of the invention are all encapsulated. A plurality of terminals are provided on and are electrically connected to the land pads on the top surface of the flexible tape. A polyimide tape is preferably used as the flexible tape of the invention.

The circuit layer may include multilayered circuit traces in which upper circuit traces are disposed over lower circuit traces with an insulating layer being interposed therebetween.

The encapsulant may be provided by a method of supplying liquid resin having a certain viscosity into the opening and over the bonding pads. A dispenser is preferably used for the supplying the resin. Moreover, the package may comprise a dam extending on the top surface of the flexible tape radially outward of the bonding pads and around the opening, so that the dam will prevent the liquid resin from overflowing as it is supplied onto the bonding pads. The dam may be also formed by a method similar to that used to form the encapsulant.

The encapsulant extends a first predetermined distance from the circuit layer, and each terminal extends a second predetermined distance from the circuit layer, the first predetermined distance preferably being less than the second predetermined distance.

The flexible circuit board may further include a protective layer on the top surface of the flexible tape so as to protect the circuit traces. In addition, the protective layer may have a groove extending between the bonding pads and the land pads. The aforementioned dam can be provided in the groove and rise above the protective layer so that the dam will prevent the liquid resin, used to form the encapsulant, from overflowing. A polyimide layer is preferably used as the protective layer.

The flexible circuit board may also further include a stiffener on the bottom surface of the flexible tape. The stiffener can be made of a material having the same coefficient of thermal expansion as that of a mother board to which the package will be mounted. Moreover, the flexible circuit board may further include an adhesive layer between the stiffener and the semiconductor chip. The adhesive layer can be made of an electrically non-conductive adhesive material, such as silicone resin or a nonsilicone resin having a low modulus of elasticity.

BRIEF DESCRIPTION OF THE DRAWINGS

These and various other features and advantages of the present invention will be described with reference to the accompanying drawings, wherein.

DETAILED DESCRIPTION OF THE PREFERRED EMBODIMENTS

Figure 1:
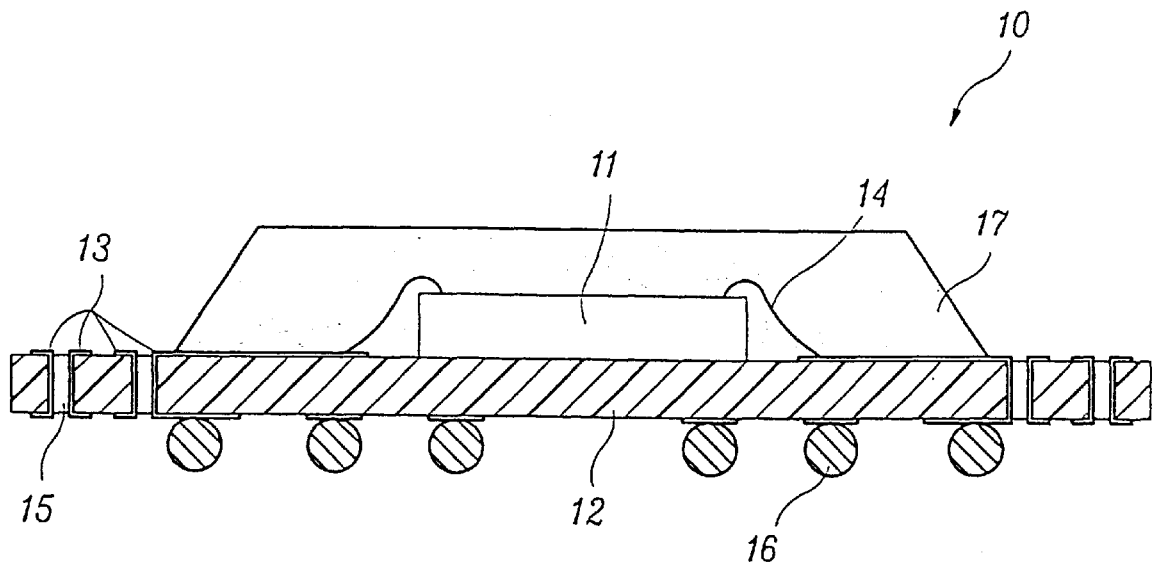
FIG. 1 is a cross-sectional view of a conventional ball grid array (BGA) semiconductor chip package.

The present invention will now be described more fully hereinafter with reference to accompanying drawings, in which preferred embodiments of the invention are shown. In the drawings, like numerals refer to like elements throughout.

Figure 2:
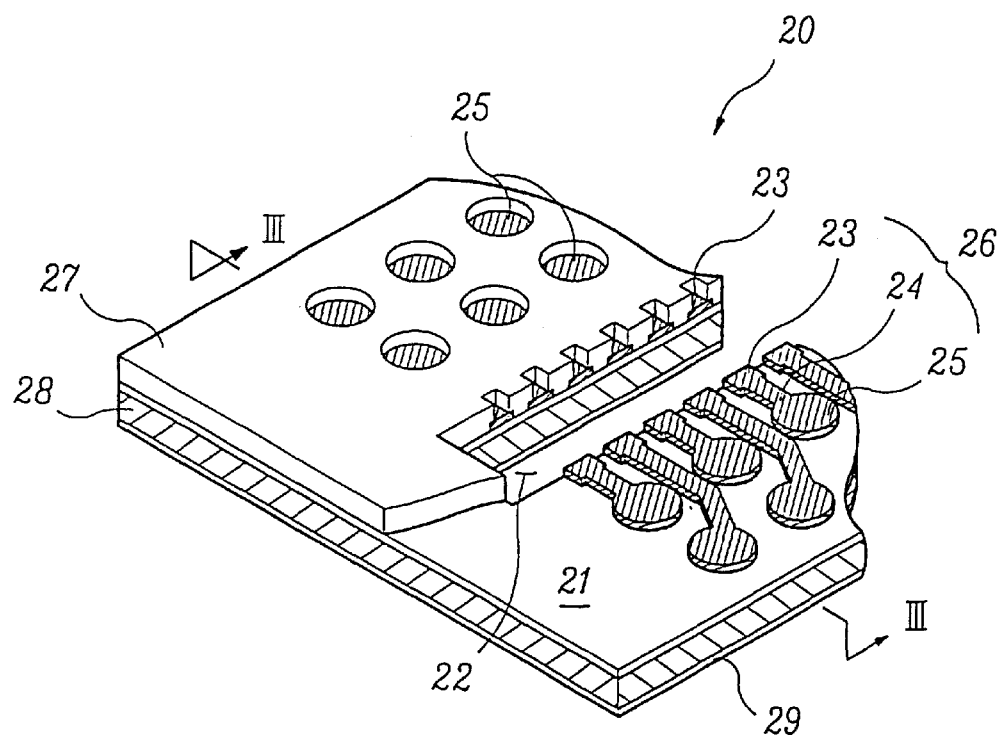
FIG. 2 is a partially cut away perspective view of one embodiment of a flexible circuit board having a central opening according to the present invention.
Figure 3:
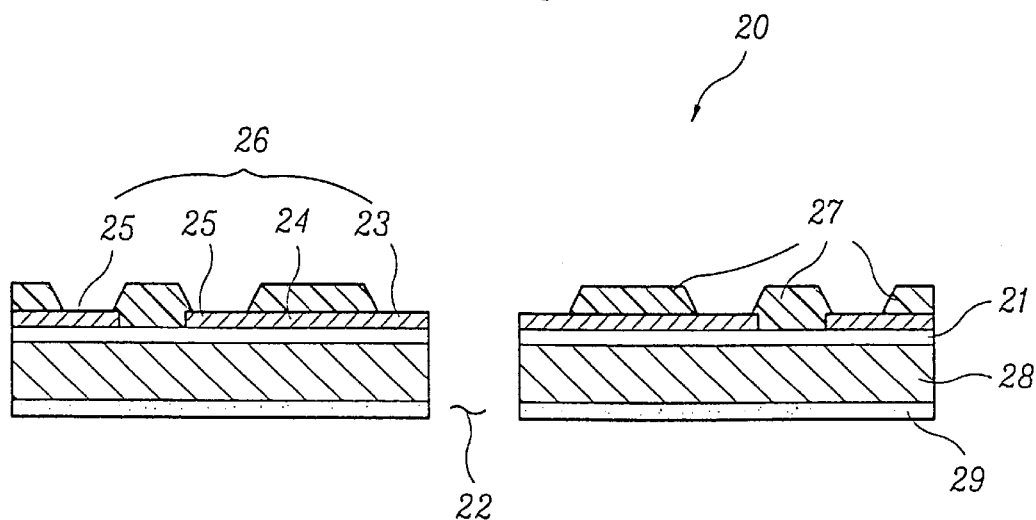
FIG. 3 is a cross-sectional view taken along line III—III of FIG. 2.
Figure 4:
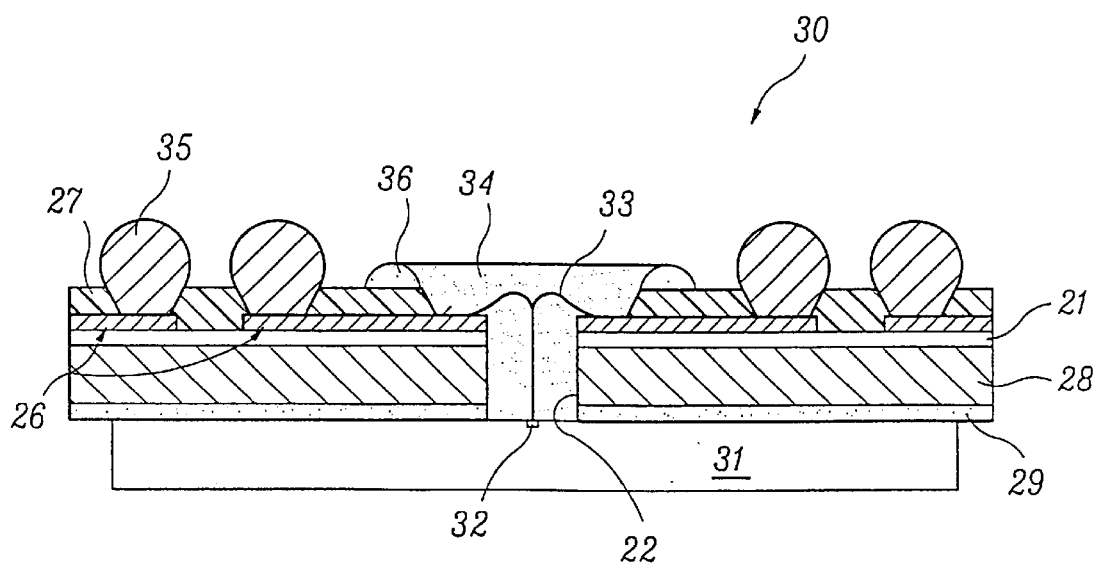
FIG. 4 is a cross-sectional view of the semiconductor chip package according to the present invention.

Referring first to FIG. 2 and FIG. 3, a flexible circuit board 20 has a patterned circuit layer 26 formed on the top surface of an electrically non-conductive flexible tape 21. The circuit layer 26 has a plurality of circuit traces 24, a respective bonding pad 23 connected to each of the traces 24 at one end, and a respective land pad 25 connected to each of the traces 24 at the other end. As shown in FIG. 4, each bonding pad 23 provides an electrical connection between a semiconductor chip 31 and a respective circuit trace 24 via metal wires 33, through a central opening 22. Each land pad 25 provides an electrical connection between a terminal 35 and the respective circuit trace 24.

The flexible tape 21 can be made of a material such as polyimides, which provide high thermal and mechanical stability. The circuit layer 26, such as a copper (Cu) a gold (Au) layer, or other conductive layer, can be formed into a pattern by etching. Specifically, copper or gold foil is laminated on the flexible tape 21 and then etched so that the pattern of circuit traces 24, bonding pads 23, and land pads 25 is formed. Preferably, the circuit layer 26 has a thickness of 18 $\mu$m or 35 $\mu$m and the circuit traces have both a width and interspacing of 50 $\mu$m. The circuit board 20 of the present invention occupies a comparatively small space because it is flexible, thin, and has fine dimensions when compared to the prior art PCB.

Figure 5:
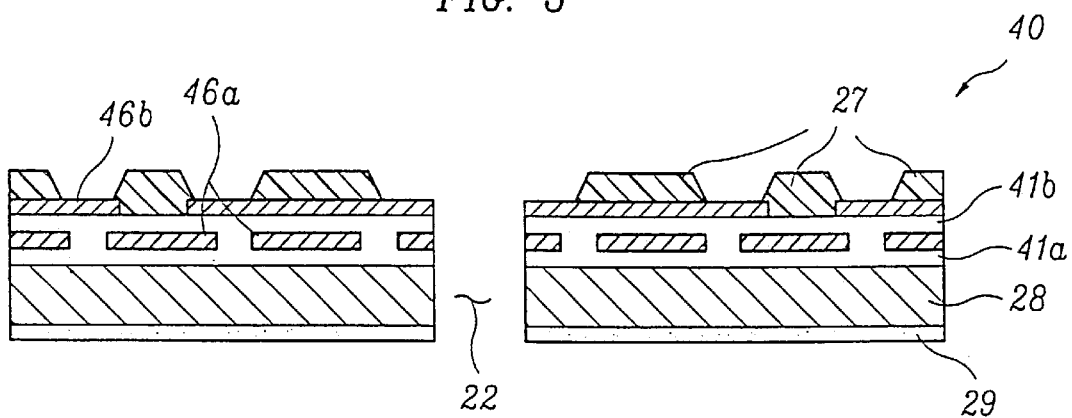
FIG. 5 is a cross-sectional view of a second embodiment of a flexible circuit board for a semiconductor package according to the present invention.

Multilayered circuit traces may be employed according to the present invention. For example, two layers of circuit traces 46a and 46b are shown in FIG. 5, with an insulating layer 41b interposed between the two layers of traces 46a and 46b. The flexible circuit board 40 having double-layered circuit traces 46a and 46b can be made by the following method. First, a piece of metal foil for forming the lower traces 46a is laminated on a flexible tape 41a as in the above-described embodiment, and then etched. Then, another flexible tape 41b is attached to the lower traces 46a, and then paths or vias (not shown) for allowing the lower traces 46a to be connected with the upper traces 46b are etched in the flexible tape 41b. A second piece of metal foil for forming the upper traces 46b is then laminated on the flexible tape 41b and etched. The circuit layer having multiple layers of circuit traces provides for a greater routing capability and better electrical performance.

Referring back to FIGS. 2 to 4, a protective layer 27 may be formed on the circuit traces 24 in order to protect the circuit traces 24 from oxidation, and a plating layer (not shown) may be formed on both the bonding pads 23 and the land pads 25 in order to enhance their bondability. A polyimide layer is preferably used as the protective layer 27, and nickel (Ni), gold (Au), or other metals may be used as the material of the plating layer (not shown). The protective layer 27 can be formed by coating a polyimide resin on the entire surface of the flexible tape 21, and then etching the resin above portions of both the bonding pads 23 and the land pads 25. The protective layer 27 which is formed on the entire surface of the flexible tape 21 as well as on the circuit traces 24 electrically isolates adjacent traces 24 from each other.

The flexible circuit board 20 of the present invention may further comprise a stiffener 28 on the bottom surface of the flexible tape 21. When the semiconductor chip package 30 is mounted to the mother board (not shown) after the completion of package assembling, if there exist some differences in the coefficients of the thermal expansion (CTE) between the package 30 and the mother board, the stress due to the differences in the CTE may result in problems such as cracks in the package or chip contamination. Therefore, a stiffener 28 having the same or similar CTE as the package-mounting pad of the mother board (not shown) can be used for reducing the difference in the CTEs. Moreover, the stiffener 28 may impart some rigidity to the flexible circuit board 20. The stiffener 28 may be divided into several parts or may have slits so as to maximize these effects. Various metals such as copper (Cu) or aluminum (Al) may be used as the stiffener 28.

The stiffener 28 is provided on the bottom surface of the flexible tape 21 because the circuit layer 26 lies on the top surface. In this case, an adhesive layer 29 may be interposed between the stiffener 28 and the chip 31. Silicone resin or a nonsilicone resin having a low modulus of elasticity is preferably used as the adhesive layer 29 because they are electrically non-conductive materials and can reduce the difference in the CTEs between the chip 31 and the stiffener 28. Of course, each of the stiffener 28 and adhesive layer 29 have central openings aligned with the central opening in the flexible tape.

The semiconductor chip 31 is attached to the surface of the flexible circuit board 20 opposite the circuit layer 26 and the terminals 35. Therefore, the circuit board 20 can have a size (area) nearly equal to that of the chip 31. The flexible circuit board 20 according to the present invention is particularly adapted for use with the chip 31 having central I/O pads 32. The central I/O pads 32 are formed across central parts of the active surface of the chip 31. The central opening 22 of the circuit board 20 permits the I/O pads 32 to be exposed therethrough. Further, the I/O pads 32 on the chip 31 can be readily interconnected to the bonding pads 23 on the top surface of the circuit board 20. These structural features allow the semiconductor chip package 30 according to the present invention to be of a size on the order of that of the chip 31, or a so-called chip size package (CSP).

The I/O pads 32 and the bonding pads 23 are connected by metal wires 33, preferably by gold wires. Thereafter, the I/O pads 32, the bonding pads 23, and the metal wires 33 are encapsulated by an encapsulant 34, so as to be protected from moisture, ion contamination, radiation, interference, and harsh environments. An epoxy resin compound may be generally used as the encapsulant 34. Although the method of potting a liquid resin compound having a certain viscosity is preferably used to provide the encapsulant 34, other methods for encapsulating can be used. For example, the encapsulant 34 can be formed by molding or lid sealing methods. The potting method encompasses both the dispensing method of injecting the resin from a syringe, and the screen printing method of applying the resin using a mask, with the dispensing method being more preferable.

Adopting the dispensing method requires forming a dam 36 on the protective layer 27, as shown in FIG. 4, for preventing the liquid resin compound from overflowing. This is because the bonding wire 33 has a height greater than that of the circuit layer 26 when the wire 33 forms an interconnection loop. Therefore, the encapsulant 34 should not only fill in the opening 22, but should also cover the bonding wire 33. However, in seeking to cover the bonding wire 33, the liquid resin compound used as the encapsulant 34 can overflow across undesired portions of the surface of the circuit board 20 despite its viscosity. In order to solve this problem, the dam 36 may be formed along outer portions of the bonding pads 23 extending around the opening 22.

The dam 36 may be formed by using a silk screening or tape adhesion method, each of which has problems. The silk screening method has a drawback of increasing the height of the dam 36, and the tape adhesion method has a problem in that it requires an expensive and less reliable tape. Therefore, a dispensing method similar to that used to form the encapsulant 34 is used to form the dam 36. Although the liquid resin compound used to form the encapsulant 34 may also be used to form the dam 36, the dam is preferably formed from a liquid resin having a viscosity greater than that of the encapsulating resin so that the dam 36 is definitely formed with the desired height and width.

Terminals 35 are formed on the land pads 25 of the circuit layer 26. The terminals 35 provide the electrical and physical connection between the package 30 and the mother board (not shown). Each terminal 35 is a metal layer in the shape of a ball or bump. Solder (Sn/Pb) balls or gold (Au) bumps are preferably used as the terminals 35. The solder balls can be formed using mounting/reflow or printing/reflow methods known to those of ordinary skill in the art, while the gold bumps can be formed using known plating or photo-masking methods.

The top of the terminal 35 is higher than the top surface of the encapsulant 34. In other words, the encapsulant 34 extends a first predetermined distance from the circuit layer 26, and the terminal 35 extends a second predetermined distance from the circuit layer 26, with the first predetermined distance being less than the second predetermined distance. Therefore, the encapsulant 34 will not contact the mother board (not shown) when the package 30 is mounted to the mother board. Furthermore, the height of the terminals 35 as formed must take into account that the overall height will be somewhat reduced when the terminals deform during mounting of the package 30. For instance, if the height of the solder ball 35 (i.e., the diameter of the ball) is 0.3 mm, it is reduced to about 0.25 mm after being provided on the circuit layer 26, and thereafter to about 0.2 mm when the package is mounted to the mother board. Accordingly, the height of the encapsulant 34 (as measured from the circuit layer 26) is preferably about 0.15 mm less than that of the original height of the terminals 35. Moreover, the height of the dam 36 (as also measured from the circuit layer 26) is preferably from about 0.1 mm to about 0.15 mm.

It is, however, difficult to form the dam 36 having a height of 0.1 mm by using the known silk screening method. It is also difficult to form a dam 36 having a height greater than 0.15 mm by using the tape adhesion method. Therefore, as described above, the dispensing method is preferably used to form the dam 36. When using the dispensing method, the minimum height and the minimum width of the dam 36 are about 0.2 mm and about 0.6 mm, respectively. Therefore, an appropriate dam 36 can be easily formed by the dispensing method when using solder ball terminals 35 having a diameter of 0.5 mm or 0.76 mm. However, difficulties arise using the dispensing method when the solder ball terminals 35 have a diameter of 0.3 mm because the dam 36 has a height (0.2 mm) similar to that of the solder ball terminals 35 after being mounted to the mother board. Another disadvantage is that the reduction in the size of the package is limited by the 0.6 mm width of the dam 36.

Figure 6:
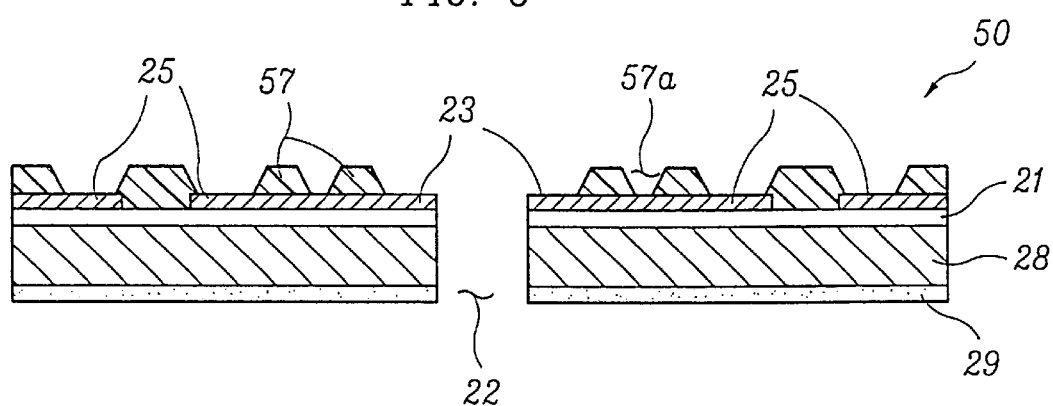
FIG. 6 is a cross-sectional view of a third embodiment of a flexible circuit board for a semiconductor package according to the present invention.
Figure 7:
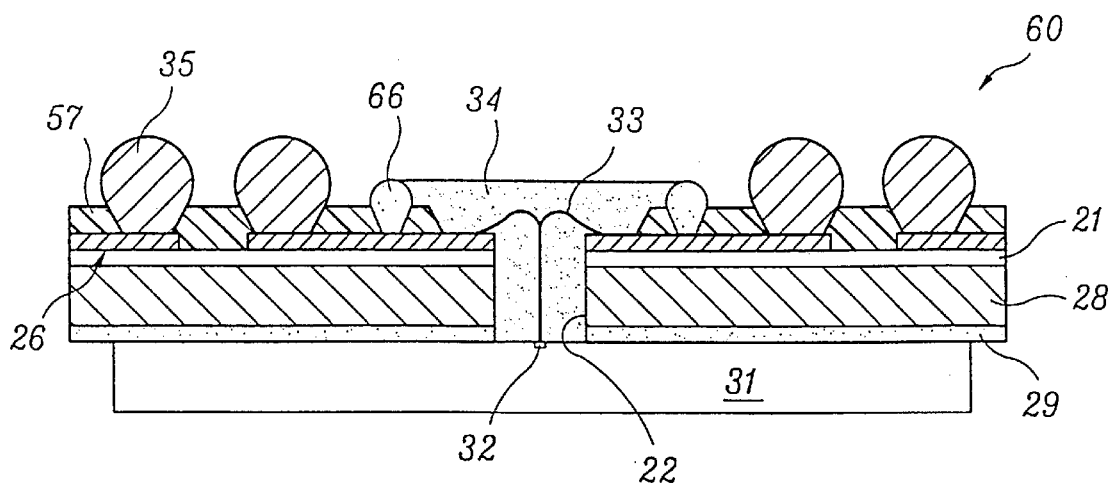
FIG. 7 is a cross-sectional view of still another embodiment of a semiconductor chip package according to the present invention.

In order to solve the problems described above, a groove can be provided in the protective layer. FIGS. 6 and 7 show a flexible circuit board 50 of another embodiment of a semiconductor chip package 60 according to the present invention. A groove 57a having a certain width and depth is formed in the protective layer 57 of this flexible circuit board 50. The groove 57a is located between the bonding pads 23 and the land pads 25. The groove 57a can be formed by etching at the same time the protective layer 57 is being etched to expose the pads of the circuit layer 26.

The groove 57a has two functions. One is to reduce the height of the dam 66, i.e., the extent to which the dam 66 extends above the circuit layer 26. Also, the groove 57a controls the width of the dam 66. In other words, the width of the dam 66 is proportionate to that of the groove 57a and so can be predetermined by selecting an appropriate groove 57a width. Without the groove 57a, the minimum width of the dam 66 is about 0.6 mm as previously stated. However, the groove 57a can allow a dam having a width of about 0.3 mm to be formed.

Th groove 57a could also serve the role of the dam. If the liquid resin of the encapsulant 34 were to overflow the opening 22, the liquid resin would flow into the groove 57a, thereby preventing the resin from overflowing onto the land pads. In this way, the groove 57a can act as a dam making the dam 66 unnecessary.

Although the present invention has been described above in connection with the preferred embodiments thereof, the invention may be embodied in many different forms and should not be construed as limited to the embodiments set forth herein. Rather, all such embodiments which fall within the scope of the appended claims are seen to be within the true spirit and scope of the present invention.

What is claimed is:

1. A semiconductor chip package comprising:
   a semiconductor chip having an active surface, and a plurality of input/output (I/O) pads extending across central parts of said active surface;

a flexible circuit board including an electrically non-conductive flexible tape having a top surface, a bottom surface, an outer periphery and a central opening therein, and a patterned circuit layer on the top surface of said flexible tape, said circuit layer having a plurality of circuit traces, bonding pads to which first ends of said circuit traces are connected, respectively, and land pads to which second ends of said circuit traces are connected, respectively, wherein said circuit traces, said bonding pads, and said land pads are positioned on the top surface of the flexible tape and within the outer periphery of the flexible tape, and wherein the active surface of said semiconductor chip faces the bottom surface of said flexible tape and the central opening of the flexible tape, with said I/O pads being exposed to the patterned circuit layer through said opening of said flexible tape;

a protective layer disposed on the top surface of said flexible tape over said circuit traces, wherein said protective layer has a groove extending therein between said bonding pads and said land pads;

a plurality of bonding wires extending between said I/O pads and said bonding pads through said central opening, each of said I/O pads being electrically connected to a respective one of said bonding pads by a respective one of said bonding wires;

an encapsulant covering said I/O pads, said bonding pads, and said bonding wires; wherein said encapsulant is confined radially inward by said groove; and a plurality of terminals provided on and electrically connected to said land pads on the top surface of said flexible tape, each of the plurality of terminals providing an electrical connection leading from the semiconductor package.

2. The semiconductor chip package of claim 1, wherein said flexible circuit board has a surface area substantially the same as that of said semiconductor chip.

3. The semiconductor chip package of claim 1, wherein said circuit traces are multilayered and comprise lower circuit traces, and upper circuit traces disposed above the lower circuit traces in the package, and further comprising an insulating layer interposed between said upper and lower circuit traces.

4. The semiconductor chip package of claim 1, wherein said flexible tape comprises a polyimide tape.

5. The semiconductor chip package of claim 1, wherein said encapsulant is a resin filling said central opening of the flexible tape.

6. The semiconductor chip package of claim 1, wherein said encapsulant extends upwardly a first predetermined distance from said circuit layer, wherein each of said terminals extends a second predetermined distance upwardly from said circuit layer, and wherein said first predetermined distance is less than said second predetermined distance, where said bonding pads are located.

7. The semiconductor chip package of claim 1, wherein said protective layer comprises a polyimide film.

8. The semiconductor chip package of claim 1, wherein said flexible circuit board further includes a stiffener on the bottom surface of said flexible tape, the stiffener having a central opening aligned with the central opening of the flexible tape.

9. The semiconductor chip package of claim 8, wherein said flexible circuit board further includes an adhesive layer between said stiffener and said semiconductor chip, the adhesive layer having a central opening aligned the respective central openings of the stiffener and the flexible tape.

10. The semiconductor chip package of claim 9, wherein said adhesive layer is of an electrically non-conductive adhesive material selected from the group consisting of silicone resin and nonsilicone resin having a low modulus of elasticity.

11. A semiconductor chip package comprising:

a semiconductor chip having an active surface with at least one input/output pad on a central portion thereof;

a flexible circuit board having a central opening therethrough, a top surface of said flexible circuit board having a patterned circuit layer thereon including at least one conductive trace having a bond pad coupled to a first end thereof and a land pad coupled to a second end thereof opposite the first end, the active surface of said semiconductor chip being adhered to a bottom surface of said flexible circuit board, the central portion of said semiconductor chip being aligned with the central opening of said flexible circuit board;

a protective layer disposed on the top surface of said flexible circuit board;

bonding wires extending between the bond pad of the at least one conductive trace and the at least one input/output pad via the central opening;

an encapsulant formed within the central opening on the at least one input/output pad and that covers the bond pad of the at least one conductive trace and said bonding wires; and a groove, formed in said protective layer between the bond pad and the land pad of the at least one conductive trace, that confines said encapsulant to an area radially inward and away from the land pad of the at least one conductive trace.

12. The semiconductor chip package of claim 11, wherein said flexible circuit board comprises an electrically non-conductive flexible tape.

13. The semiconductor chip package of claim 12, wherein the electrically non-conductive flexible tape comprises a polyimide tape.

14. The semiconductor chip package of claim 12, wherein said flexible circuit board further comprises a stiffener on a bottom surface of the electrically non-conductive flexible tape.

15. The semiconductor chip package of claim 11, wherein a terminal is provided on the land pad of the at least one conductive trace, said encapsulant extending upwardly from the top surface of said flexible circuit board a first distance and the terminal extending upwardly from the top surface of said flexible circuit board a second distance, the first distance being less than the second distance.

16. The semiconductor chip package of claim 11, wherein a surface area of said flexible circuit board is substantially the same as a surface area of said semiconductor chip.

17. The semiconductor chip package of claim 11, wherein the at least one conductive trace comprises multilayered conductive traces including upper conductive traces disposed above and separated from lower conductive traces by an insulating layer.

18. The semiconductor chip package of claim 11, wherein said encapsulant is an epoxy resin compound.

19. The semiconductor chip package of claim 11, wherein said protective layer is a polyimide film.

* * * * *